United States Patent [19]

Amemiya et al.

[11] Patent Number: 5,231,291
[45] Date of Patent: Jul. 27, 1993

[54] WAFER TABLE AND EXPOSURE APPARATUS WITH THE SAME

[75] Inventors: Mitsuaki Amemiya, Atsugi; Eiji Sakamoto, Sagamihara; Koji Uda, Yokohama; Kunitaka Ozawa, Isehara; Kazunori Iwamoto, Yokoyama; Shunichi Uzawa, Tokyo; Mitsuji Marumo, Atsugi, all of Japan

[73] Assignee: Canon Kabushiki Kaisha, Tokyo, Japan

[21] Appl. No.: 821,888

[22] Filed: Jan. 17, 1992

Related U.S. Application Data

[63] Continuation of Ser. No. 560,762, Jul. 31, 1990, abandoned.

Foreign Application Priority Data

Aug. 1, 1989 [JP] Japan ................... 1-197957

[51] Int. Cl.$^5$ .................... G01N 21/00; G01N 23/00; G21K 5/10
[52] U.S. Cl. .................... 250/443.1; 250/440.11; 250/442.11
[58] Field of Search ............... 250/443.1, 442.1, 440.1, 250/492.21, 443.11, 442.13, 442.11

[56] References Cited

U.S. PATENT DOCUMENTS

| | | | |
|---|---|---|---|
| 4,432,635 | 2/1984 | Mayer | 355/30 |
| 4,453,080 | 6/1884 | Berkowitz | 250/443.1 |
| 4,503,335 | 3/1985 | Takahashi | 250/548 |
| 4,663,944 | 5/1987 | Bernius et al. | 250/443.1 |
| 4,749,868 | 6/1988 | Hatanaka et al. | 250/443.1 |
| 4,879,467 | 11/1989 | Muller et al. | 250/442.1 |
| 4,950,901 | 8/1990 | Jones et al. | 250/443.1 |
| 4,987,933 | 1/1991 | Mack | 250/492.21 |
| 5,063,582 | 11/1991 | Mori et al. | 378/34 |
| 5,093,579 | 3/1992 | Amemiya et al. | 250/453.11 |

FOREIGN PATENT DOCUMENTS

| | | |
|---|---|---|
| 0320297 | 6/1989 | European Pat. Off. |
| 0357423 | 3/1990 | European Pat. Off. |
| 3213239 | 11/1982 | Fed. Rep. of Germany |
| 3306999 | 10/1983 | Fed. Rep. of Germany |
| 53-15768 | 2/1978 | Japan |

*Primary Examiner*—Bruce C. Anderson
*Attorney, Agent, or Firm*—Fitzpatrick, Cella, Harper & Scinto

[57] ABSTRACT

A wafer table includes a wafer holding surface for holding a wafer by attraction; a flow passageway through which a temperature adjusting medium flows to remove any heat in the wafer table; a temperature measuring system for measuring the temperature of the wafer held by the wafer holding surface; a temperature adjusting system disposed between the wafer holding surface and the flow passageway; a temperature setting system for setting a temperature related to the wafer held by the wafer holding surface; a flow rate controlling system for controlling the flow rate of the temperature adjusting medium to be circulated through the flow passageway; and a temperature controlling system for controlling the operation of the temperature adjusting system related to heat, on the basis of a value set by the temperature setting system and a value measured by the temperature measuring system.

16 Claims, 4 Drawing Sheets

WAFER TABLE AND EXPOSURE APPARATUS WITH THE SAME

This application is a continuation of prior application Ser. No. 07/560,762 filed Jul. 31, 1990, now abandoned.

FIELD OF THE INVENTION AND RELATED ART

This invention relates to a wafer table having a carrying surface for carrying a wafer and an exposure apparatus with the same, wherein the wafer table has a function for controlling the temperature of the wafer placed on the carrying surface.

In a semiconductor lithographic process, an exposure apparatus is used to expose a wafer to a mask with an appropriate exposure energy to thereby transfer a pattern, formed on the mask, onto the wafer. In such a lithographic process, it is necessary to exactly control the temperature of a wafer, in order to assure that the pattern of a mask is transferred to the wafer with high precision. That is, in one aspect, for preventing thermal distortion of the wafer due to temperature rise of the same during the exposure operation by the exposure energy and, in another aspect, for removing any process distortion as disclosed in Japanese Laid-Open Patent Application, Laid-Open No. Sho 53-15768, the temperature of a wafer is controlled so as to correct, the before start of exposure, any magnification error through thermal contraction.

Conventionally, the temperature of a wafer is controlled by flowing a temperature adjusting fluid, such as constant temperature water, through the inside of a wafer carrying table.

SUMMARY OF THE INVENTION

With the conventional method, however, the passage of the constant-temperature water through the passageway in the wafer table transmits disturbance to the wafer table and, as a result of which, the wafer table itself vibrates. This leads to a possibility of degradation of the resolution or the positioning accuracy.

Further, the tendency to miniaturization of a pattern to be transferred has forced control of the wafer temperature on an order of ±0.01 (deg) and, therefore, the temperature control of the wafer for the temperature adjustment has to bear a large burden.

It is accordingly an object of the present invention to provide a wafer table and/or an exposure apparatus with the same, which is effective to prevent vibration of the wafer table due to the flow of constant temperature water and, also, which is effective to reduce the burden with regard to the temperature control of the constant temperature water.

In accordance with an aspect of the present invention to achieve the above object, there is provided a wafer table including temperature controlling means for controlling the temperature of a wafer placed on the table, a flow passageway for circulating a temperature adjusting medium for removing, outwardly, any heat of the wafer table and/or the temperature controlling means, and flow rate controlling means for adjusting the flow rate of the temperature adjusting medium.

In accordance with another aspect of the present invention, there is provided an exposure apparatus with a wafer table, such as a photolithographic exposure apparatus, an x-ray exposure apparatus, an electron beam pattern drawing apparatus or the like. In such an exposure apparatus, during the wafer exposure operation or the alignment and exposure operation, flow rate controlling means operates to reduce the flow rate of the temperature adjusting medium such that any vibration resulting from the flow of the temperature adjusting medium does not substantially influence to the exposure precision or the alignment precision.

In this structure, for exposure or pattern drawing of a wafer or, alternatively, for positioning of the wafer, the temperature of the wafer is controlled only by the temperature controlling means or, alternatively, by the combination of the temperature controlling means and the temperature adjusting medium whose flow rate is restricted by the flow rate controlling means to a level not causing vibration. As a result, the exposure or pattern drawing, or, the positioning of the wafer can be executed precisely, without being influenced by the vibration. The temperature control of the wafer through the temperature controlling means may be effected, for example, by transmitting the heat of the wafer to the flow passageway side, for circulation of the temperature adjusting medium or, alternatively, by heating the wafer. In any way, the temperature control is effected relatively finely and exactly. During a time period other than that for the exposure or pattern drawing of the wafer or the positioning of the same, a small vibration does not cause any inconvenience. Accordingly, the flow rate controlling means uses a sufficient flow rate of the temperature adjusting medium to discharge the heat accumulated in the wafer table by the exposure or the like. Accordingly, with the present invention, the exposure process of a wafer can be executed while assuring the temperature control and the vibration prevention at the same time.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
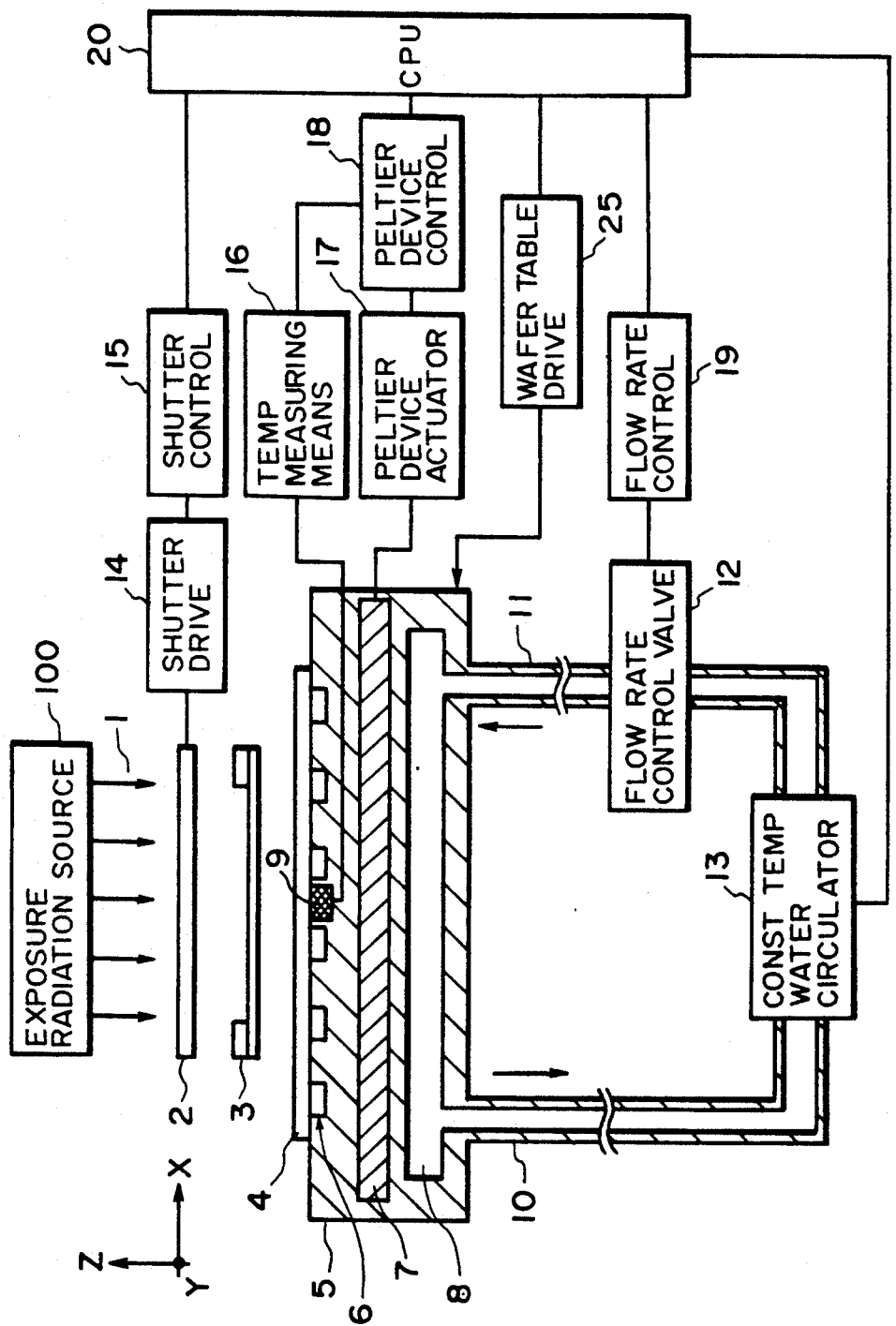
FIG. 1 is a schematic and diagrammatic view of an exposure apparatus with a wafer table, according to an embodiment of the present invention.

FIG. 1 schematically illustrates a step-and-repeat type exposure apparatus with a wafer table, according to an embodiment of the present invention. In FIG. 1, denoted at 1 is exposure radiation energy such as light or X-rays, for example, supplied from an exposure radiation source 100; at 2 is a shutter for defining a desired exposure time; at 3 is a mask and at 4 is a wafer. The mask 3 and the wafer 4 are opposed to each other and are substantially parallel to an X-Y plane, with a small gap maintained therebetween. The irradiation of the mask 3 and the wafer 4 with the exposure radiation energy 1 is controlled by opening/closing the shutter 2. Denoted at 5 is a wafer table for holding the wafer 4 thereon. The wafer table is provided with vacuum grooves 6 for holding by vacuum the wafer 4 on its wafer holding surface, a Peltier device 7 effective to transmit the thermal energy produced inside the wafer table by the exposure radiation rays 1 to a constant temperature water side, a flow passageway 8 for circulating constant temperature water for removing the heat from the Peltier device 7, and a temperature detector 9 for detecting the temperature of the wafer 4. Denoted at 10 and 11 are an outlet port and an inlet port for the constant temperature water, respectively, provided on the wafer table 5; at 13 is a constant temperature water circulating device for circulating the constant temperature water; and at 12 is a flow rate controlling valve for controlling the flow rate of the constant temperature water. The flow rate of the constant temperature water from the circulating device 13 is controlled by the flow rate controlling valve 12 and, thereafter, the water is supplied from the inlet 11 into the wafer table 5. From the wafer table 5, the water flows through the outlet 10 back to the circulating device 13. Denoted at 14 is a shutter drive for actuating the shutter 2; and at 15 is a shutter control for controlling the opening/closing of the shutter 2 to thereby control the amount of exposure of the mask 3 and the wafer 4 to the exposure radiation rays 1 and to control the transfer of a pattern of the mask 3 to the wafer 4. The exposure apparatus of the illustrated embodiment is of a step-and-repeat type, and in response to completion of exposure of a certain zone of the wafer 4, the wafer 4 is displaced with the wafer table 5 along the X-Y plane by a predetermined distance so that the next zone of the wafer 4 is placed at the exposure station. Such step-and-repeat movement is repeated until all the zones of the wafer are exposed. Denoted at 16 is a temperature measuring portion for measuring the temperature by use of the temperature detector 9. Denoted at 17 is an actuator for the Peltier device 7; at 18 is a Peltier device control; at 19 is a flow rate controller for controlling the flow rate controlling valve 12; and at 20 is a central processing unit (CPU) for controlling various controllers as mentioned above. Also, denoted at 25 is a wafer table drive, including an X-Y stage of well-known type, for moving the wafer table 5 in the X-axis and Y-axis directions for the alignment of the wafer 4 with the mask 3 and/or for the step-and-repeat exposures of the wafer 4.

The operation of the above-described structure will be explained.

First, as the information for the control of the wafer temperature, the temperature of the wafer 4 is measured by the temperature detector 9, and a signal representing the result of the measurement is transmitted from the temperature measuring portion 16 to the Peltier device controller 18. In response to reception of the signal, the Peltier device controller 18 actuates the Peltier device 7 through the actuator 17, such that the heat at the wafer 4 side of the Peltier device 7 is transmitted to the constant temperature water side, whereby the temperature of the wafer 4 is controlled to and always kept at a predetermined temperature (for example, 23°±0.01° C.).

On the other hand, the constant temperature circulating device 13 supplies constant temperature water whose temperature is controlled to a predetermined temperature for example, 23.1°±0.1° C. The supplied constant temperature water is introduced from the flow rate controlling valve 12 and through the inlet 11, into the flow passageway 8, and removes the heat at the bottom side of the Peltier device 7 (a side thereof remote from the wafer 4). After this, the water is discharged through the outlet 10 back to the constant water circulating device 13.

The circulation of the constant temperature circulating water is stopped during the exposure period of the mask 3 and the wafer 4 to the exposure radiation rays 1 and, also, during the alignment period for the mask 3 and the wafer 4. During time periods other than those, for example, during the stepwise movement period of the wafer 4 or replacement of the wafer 4 on the wafer table 5, the circulation of the constant temperature water is executed. Hereinafter, such a period will be referred to as a "non-exposure period".

During the exposure period, the circulation of the constant temperature water is stopped. However, by the actuation of the Peltier device 7, the temperature of the wafer 4 can be maintained constant. Also, since the circulation of the constant temperature water is stopped at this time, substantially no vibration occurs in the wafer table 5. It is to be noted however that any heat produced at this time by the irradiation with the exposure radiation rays 1 is not discharged outwardly of the wafer table 5 by the constant temperature water. As a result, the temperature at the bottom side of the Peltier device 7 increases. In consideration thereof, during a non-exposure period after the completion of the exposure of a current zone and before start of the exposure or the alignment of the next zone of the wafer, the CPU 20 supplies an instruction signal to the controller 19 so as to decrease the temperature at the bottom side of the Peltier device 7 back to the temperature substantially the same as that assumed before the exposure operation or, alternatively, to a predetermined temperature substantially the same as that of the wafer 4, and through the flow rate controller 19 and thus the flow rate adjusting valve 12, controlled flow rate of the constant temperature water is provided.

Next, the sequence of the exposure operation will be explained by reference to the flow chart of FIG. 2. When the exposure sequence starts, first the circulation of the constant temperature water by the circulating device 13 is stopped (step a). This is done by stopping the operation of the circulating device 13 and/or by closing the flow rate adjusting valve 12. Subsequently, the position of the wafer table 5 is adjusted by the wafer table drive 25 (step b) so as to assure that the pattern of the mask 3 can be transferred to a predetermined site on the wafer 4. After this, the shutter 2 is opened for a predetermined time period, and the exposure starts (step c). After elapse of the predetermined time for exposure of the mask 3 and the wafer 4, the shutter 2 is closed and the exposure is finished (step d). After this, the circulation of the constant temperature water by the circulating device 13 is started (step e). This is done by re-starting the operation of the circulating device 13 and/or by opening the flow rate adjusting valve 12. Subsequently, the wafer table 5 is moved stepwise by the wafer table drive 25 along the X-Y plane through a predetermined distance (step f), to allow exposure of the next zone of the wafer 4. Then, the sequence goes back to step a and a similar exposure operation is repeated until the exposures of all the zones of the wafer 4 are completed.

During the execution of the above-described exposure operation sequence, as described, the Peltier device 7 is actuated continuously so as to maintain the wafer 4 constantly at a predetermined temperature.

While the foregoing description has been made of an example wherein the circulation of the water is stopped during the alignment operation period and the exposure operation period, the circulation of the constant temperature water itself may be executed provided that it does not produce vibration of the wafer table 5 of a degree that influences the alignment precision of the mask 3 and the wafer 4 or the resolution of the pattern transferred from the mask 3 to the wafer 4. On that occasion, the flow rate of the constant temperature water from the circulating device 13 is controlled by the opening/closing of the flow rate controlling valve 12, in such a manner that a high flow rate is provided during the non-exposure period and a low flow rate is provided during the exposure period or the alignment period.

Figure 3:
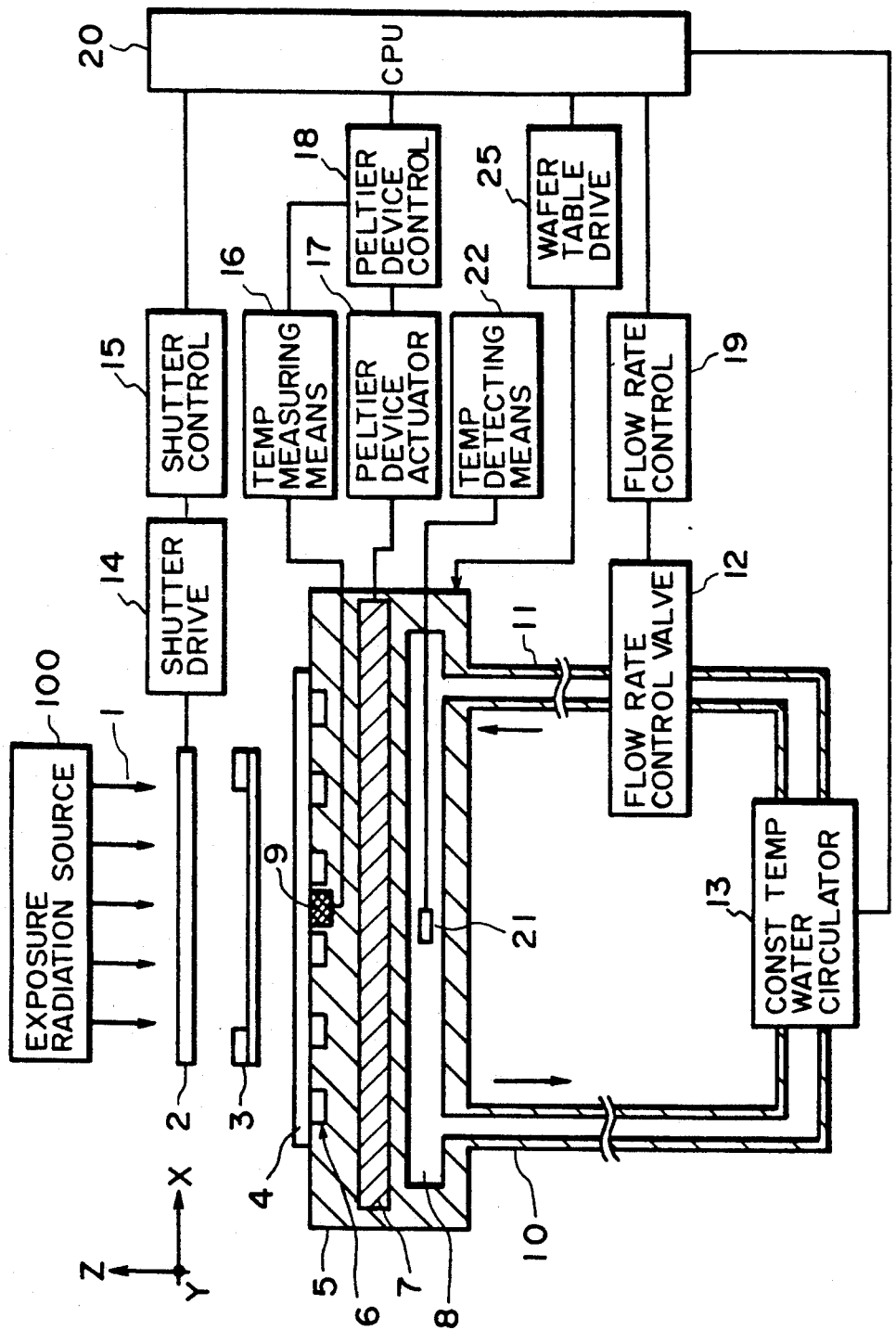
FIG. 3 is a schematic and diagrammatic view of an exposure apparatus with a wafer table, according to another embodiment of the present invention.

FIG. 3 shows another embodiment of the present invention, wherein denoted at 21 is a temperature detector for measuring the temperature of the constant-temperature water within the flow passageway 8 as formed in the wafer table 5. The measured value is transmitted through the temperature measuring portion 22 to the CPU 20. The structure of the remaining portion of this embodiment is essentially the same as that of the FIG. 1 embodiment.

Figure 2:
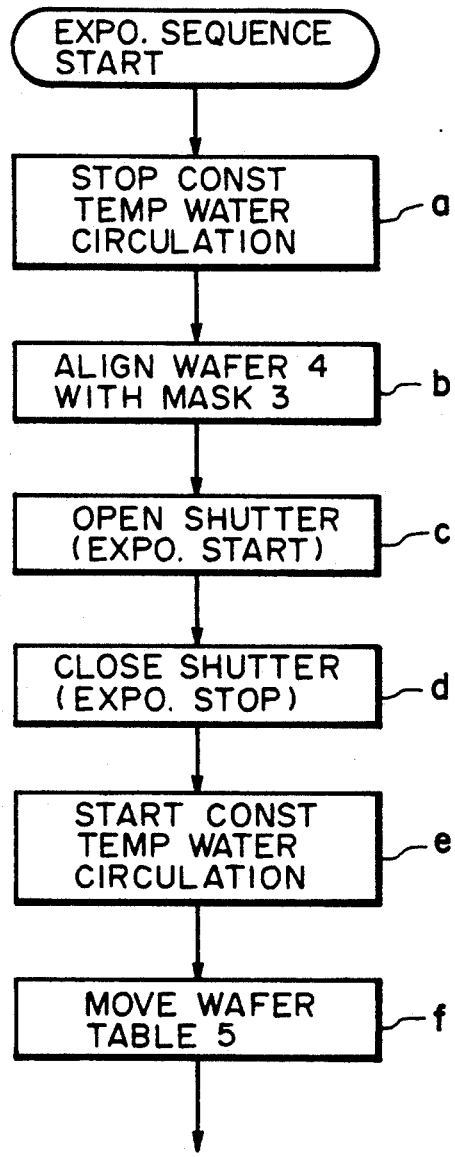
FIG. 2 is a flow chart, for explaining the operation of the FIG. 1 embodiment.

In the structure described above, after completion of the exposure at step d in FIG. 2, in a processing step corresponding to the above-described step e an instruction signal is supplied by the CPU 20 to the flow rate controller 19 to ensure that the temperature of the constant temperature water inside the wafer table 5 is controlled to a predetermined temperature, namely, the temperature as measured by the temperature detector 21 becomes equal to the predetermined temperature. In response, through the flow rate controller 19, the flow rate adjusting valve 12 is opened or closed, whereby the quantity of the constant temperature water supplied to the wafer table 5 is adjusted. It is to be noted here that the higher the temperature as measured by the detector 21 after completion of the exposure is, the larger the opening of the flow rate adjusting valve 12 as instructed from the CPU 20 to the controller 19 is. This is for the reason that, if the temperature of the circulating water after completion of exposure is high, it is desirable to increase the flow rate to remove the heat from the wafer table 5 quickly. When the temperature measuring portion 22 discriminates through the temperature detector 21 that the temperature of the circulating water in the wafer table 5 has reached the predetermined temperature, CPU 20 operates to start the exposure sequence at step a in FIG. 2.

On this occasion, however, it is not always necessary that the predetermined temperature set to the constant temperature water within the wafer table 5 is equal to the predetermined temperature set to the wafer 4. Also, it is not always necessary that the temperature of the constant temperature water as circulated from the circulating device 13 is equal to the set temperature of the wafer 4.

For example, when the set temperature of the wafer 4 is 23°±0.01° C., constant temperature water of 22°±0.1° C. may be supplied from the constant temperature water circulating device 13. On this occasion, when the shutter 2 is closed and the exposure radiation rays 1 do not impinge on the wafer 4, it is possible that the temperature of the wafer 4 is lower than the set temperature (23°±0.01° C.).

In consideration thereof, on this occasion, the polarity of the Peltier device 7 may be inverted so that the Peltier device may operate as a heater to increase the temperature of the wafer 4 to the predetermined temperature. Then, since, in response to the start of exposure, thermal energy is applied to the wafer 4 by the exposure radiation rays 1, the Peltier device 7 may be operated as a heat pump to discharge the heat at the wafer 4 side to the constant temperature side in the flow passageway 8, to thereby prevent temperature rise in the wafer 4.

The temperature of the constant temperature water within the wafer table 5, as measured by the temperature detector 21, is fed back to the circulating device 13 and, in response, the circulating device 13 controls the temperature of the water, being supplied therefrom, so as to assure that the water within the wafer table 5 has a temperature equal to a predetermined temperature.

Figure 4:
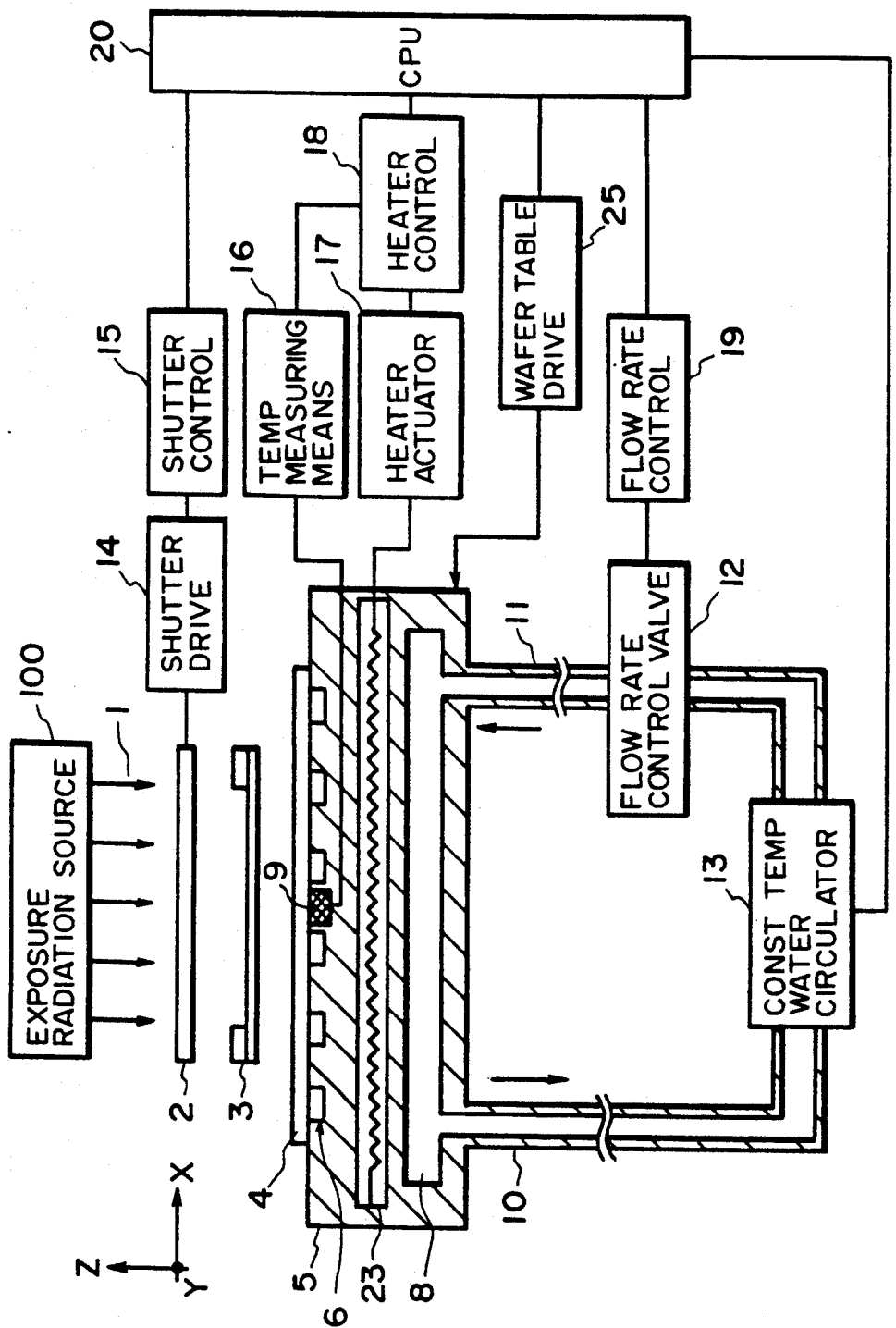
FIG. 4 is a schematic and diagrammatic view of an exposure apparatus with a wafer table, according to a further embodiment of the present invention.

FIG. 4 shows a further embodiment, wherein the Peltier device 7 is replaced by a heater 23. The remaining portion of this embodiment is essentially the same as that of the FIG. 1 embodiment.

In this embodiment, the temperature of the constant temperature water is determined so that, when the circulation of the constant temperature water through the circulating device 13 is stopped and when the heater 23 is not actuated, a wafer 4 is maintained during the exposure period at a temperature not higher than a set temperature of 23° C. For example, if the temperature rise of the wafer 4 during the exposure period is 1.5 (deg), the temperature of the constant temperature water to be supplied from the constant temperature water circulating device 13 is set to a level (e.g. 21° C.), lower than 21.5° C. Then, the heater 23 is energized during the exposure period of the wafer 4 so as to assure that the wafer 4 is maintained throughout the exposure period (from the start to the end of the exposure) constantly at the set temperature of 23°±0.01° C. More specifically, if, just after the start of the exposure, the temperature of the wafer 4 is not increased to the set temperature only by the application of the energy with the irradiation of the exposure radiation rays 1, the heat generation of the heater 23 is increased to attain the set temperature of the wafer 4. As the total exposure amount of the wafer 4 with the irradiation by the exposure radiation rays 1 increases, with the lapse of time, the temperature of the wafer 4 rises and, therefore, the heat generation of the heater 23 is reduced gradually, whereby even just before completion of the exposure, the wafer 4 can be retained at the set temperature. The circulation of the constant temperature water during the exposure period and the non-exposure period, is the same as that of the FIG. 1 embodiment.

While the foregoing description has been made to examples wherein a Peltier device or a heater is used as a temperature controlling means for the constant temperature circulating water, in place of such devices, a temperature controlling means, such as a heat pipe, for example, of the type in which any vibration thereof is very small and can be disregarded as compared with that to be produced by circulation of the constant temperature water, may effectively be used. Also, it is not always necessary to use water as the heat removing means for discharging the heat of the wafer table 5 outwardly, and any other cooling medium may be used.

Further, while in the preceding embodiments description has been made of an example wherein the wafer temperature during the exposure period is controlled to a constant level, since with the wafer table of the present invention the temperature of the wafer 4 can be set during the exposure period at a desired level substantially without vibration, the wafer table of the present invention can be effectively used in such a system wherein means is provided to change the temperature of a wafer for expansion/contraction of the wafer so as to correct the distortion of the wafer, if any, produced during a process other than the exposure process, such as disclosed in the aforementioned Japanese Laid-Open Patent Application, Laid-Open No. Sho 53-15768 for example.

Further, the invention is not limited to a wafer table in a photolithographic apparatus, but it is effectively also applicable to a wafer table in an apparatus, such as an electron beam pattern drawing apparatus, wherein precise positioning is required.

With the provision of a temperature controlling means for precisely controlling the temperature of a wafer substantially without vibration and a temperature controlling means capable of removing, outwardly, the heat in the wafer table as supplied from the outside, and of controlling the flow rate of the medium in accordance with the state of exposure, in the present invention, it is possible to maintain the wafer temperature at a desired level and, additionally, it is possible to prevent degradation of the pattern printing precision due to vibration during the exposure period. As a result, the wafer processing such as high-precision patterning thereof, for example, is ensured.

While the invention has been described with reference to the structures disclosed herein, it is not confined to the details set forth and this application is intended to cover such modifications or changes as may come within the purposes of the improvements or the scope of the following claims.

What is claimed is:

1. A wafer table, comprising:
    a wafer holding surface for holding a wafer by attraction;
    a flow passageway through which a temperature adjusting medium flows to remove any heat in said wafer table;
    a temperature sensor disposed in said flow passageway, for measuring the temperature of the temperature adjusting medium in said flow passageway, wherein the temperature of the temperature adjusting medium in said flow passageway can be adjusted to a predetermined level on the basis of a value measured by said temperature sensor;
    temperature measuring means for measuring the temperature of the wafer held by said wafer holding surface;
    temperature adjusting means disposed between said wafer holding surface and said flow passageway;
    temperature setting means for setting a temperature related to the wafer held by said wafer holding surface;
    flow rate controlling means for controlling the flow rate of the temperature adjusting medium circulated through said flow passageway; and
    temperature controlling means for controlling the operation of said temperature adjusting means related to heat, on the basis of a value set by said temperature setting means and a value measured by said temperature measuring means.

2. A wafer table according to claim 1, wherein said temperature adjusting means comprises one of a Peltier device and a heating device.

3. A wafer table according to claim 1, further comprising means for setting the temperature of the temperature adjusting medium to a level lower than a temperature set to the wafer by said temperature setting means.

4. A wafer table according to claim 3, wherein said temperature adjusting means comprises a heating device for heating the wafer held by said wafer holding surface.

5. An exposure apparatus for exposing a wafer with radiation, said apparatus comprising:
    a table having a holding surface, for holding the wafer by attraction;
    a flow passageway through which a temperature adjusting medium flows to remove heat in said table;
    temperature measuring means for measuring the temperature of the wafer held by said holding surface;
    temperature adjusting means disposed between said holding surface and said flow passageway;
    temperature setting means for setting a temperature related to the wafer held by said holding surface;
    flow rate controlling means for controlling the flow rate of the temperature adjusting medium circulated through said flow passageway, wherein said flow rate controlling means comprises means for increasing the flow rate of the temperature adjusting medium at least in a portion of a period in which the wafer is not exposed with the radiation, as compared with a period when the wafer is exposed with the radiation; and
    temperature controlling means for controlling the operation of said temperature adjusting means related to heat, on the basis of a value set by said temperature setting means and a value measured by said temperature measuring means.

6. An apparatus according to claim 5, wherein said temperature adjusting means comprises means for reducing vibration of said table produced from circulation of the temperature adjusting medium.

7. An apparatus according to claim 5, further comprising a radiation source for generating the exposure radiation.

8. An exposure method for exposing a wafer with radiation, said method comprising the steps of:
    attracting and holding a wafer onto a wafer holding surface of a table;
    adjusting the temperature of the wafer held by the wafer holding surface, by means of a temperature adjusting device disposed between the wafer holding surface and a passageway through which a temperature adjusting medium flows for removal of heat in the table; and
    supplying, after the exposure of the wafer with the radiation, an increased flow rate of the temperature adjusting medium through the passageway as compared with the flow rate during the exposure of the wafer with the radiation.

9. A method according to claim 8, further comprising measuring the temperature of the wafer held by the wafer holding surface by a wafer temperature measuring device, setting the temperature related to the wafer held by the wafer holding structure by a temperature setting device and controlling the temperature adjusting device on the basis of the measured value from the wafer temperature measuring device and the temperature value set by the temperature setting device.

10. A method according to claim 9, further comprising measuring the temperature of the temperature adjusting medium in the flow passageway, and controlling by a temperature sensor provided in the flow passageway the temperature of the temperature adjusting medium in the flow passageway to a predetermined level on the basis of a value measured by the temperature sensor.

11. A method according to claim 10, further comprising using at least one of a Peltier device and a heating device as the temperature adjusting device.

12. A method according to claim 9, further comprising setting the temperature of the temperature adjusting medium to a level lower than a temperature set to the wafer by the temperature setting device.

13. A method according to claim 12, further comprising using a heating device as the temperature adjusting device and heating the wafer held by the wafer holding surface by the heating device.

14. In an exposure method for exposing a wafer to radiation for manufacture of semiconductor devices, wherein the wafer is placed on a wafer table having a temperature controlling fluid passageway through which a temperature controlling fluid flows for temperature control of the wafer, the improvement comprising the steps of:

providing the wafer table with a low-vibration type temperature regulator whose temperature regulating operation is electrically controlled;

operating the temperature regulator during a period of exposure of the wafer to transmit any heat caused by the exposure through the temperature regulator to the temperature controlling fluid in the fluid passageway; and increasing the flow rate of the temperature controlling fluid through the fluid passageway after completion of the exposure of the wafer.

15. A method according to claim 14, further comprising exposing different portions of the wafer, in sequence, to the radiation and decreasing the flow rate of the temperature controlling fluid in response to a start of each exposure and increasing the flow rate of the temperature controlling fluid in response to completion of each exposure.

16. A method according to claim 15, further comprising using a Peltier element as the temperature regulator.

* * * * *

UNITED STATES PATENT AND TRADEMARK OFFICE
CERTIFICATE OF CORRECTION

PATENT NO. : 5,231,291
DATED : July 27, 1993
INVENTOR(S) : MITSUAKI AMEMIYA ET AL.

It is certified that error appears in the above-indentified patent and that said Letters Patent is hereby corrected as shown below:

ON THE COVER PAGE:

In Item [75] Inventors:

The address of Kazunori Iwamoto reads "Yokoyama;" and should read --Yokohama;--.

In Item [56] REFERENCES CITED:

Under "U.S. PATENT DOCUMENTS" - the following should be inserted:

--4,969,168  11/1990  Sakamoto et al. .... 378/34--.

UNITED STATES PATENT AND TRADEMARK OFFICE
CERTIFICATE OF CORRECTION

PATENT NO. : 5,231,291
DATED : July 27, 1993
INVENTOR(S) : MITSUAKI AMEMIYA ET AL.

It is certified that error appears in the above-indentified patent and that said Letters Patent is hereby corrected as shown below:

COLUMN 1:

Line 28, "the before" should read --before the--.

COLUMN 2:

Line 6, "to" should be deleted.

COLUMN 3:

Line 65, "temperature" should read --temperature,--.

Signed and Sealed this

Seventeenth Day of May, 1994

Attest:

BRUCE LEHMAN

*Attesting Officer*  Commissioner of Patents and Trademarks